United States Patent
Huang et al.

(10) Patent No.: US 9,349,701 B2
(45) Date of Patent: May 24, 2016

(54) SELF-ALIGNING CONDUCTIVE BUMP STRUCTURE AND METHOD OF FABRICATION

(71) Applicant: TAIWAN SEMICONDUCTOR MANUFACTURING COMPANY, LTD., Hsinchu (TW)

(72) Inventors: Cheng-Lin Huang, Hsinchu (TW); I-Ting Chen, Hsinchu (TW); Ying Ching Shih, Hsinchu (TW); Po-Hao Tsai, Zhongli (TW); Szu Wei Lu, Hsinchu (TW); Jing-Cheng Lin, Hsinchu (TW); Shin-Puu Jeng, Hsinchu (TW); Chen-Hua Yu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/690,581

(22) Filed: Apr. 20, 2015

(65) Prior Publication Data
US 2015/0228604 A1   Aug. 13, 2015

Related U.S. Application Data

(62) Division of application No. 13/192,756, filed on Jul. 28, 2011, now Pat. No. 9,024,438.

(51) Int. Cl.
*H01L 23/00* (2006.01)
*H01L 23/498* (2006.01)

(52) U.S. Cl.
CPC .......... *H01L 24/14* (2013.01); *H01L 23/49811* (2013.01); *H01L 24/11* (2013.01); *H01L 24/13* (2013.01); *H01L 24/17* (2013.01); *H01L 24/81* (2013.01); *H01L 2224/0346* (2013.01); *H01L 2224/03912* (2013.01); *H01L 2224/0401* (2013.01); *H01L 2224/1146* (2013.01); *H01L 2224/1161* (2013.01); *H01L 2224/11462* (2013.01); *H01L 2224/11472* (2013.01); *H01L 2224/11622* (2013.01); *H01L 2224/13011* (2013.01); *H01L 2224/13014* (2013.01); *H01L 2224/13078* (2013.01); *H01L 2224/13111* (2013.01); *H01L 2224/13139* (2013.01); *H01L 2224/13144* (2013.01); *H01L 2224/13147* (2013.01); *H01L 2224/1403* (2013.01); *H01L 2224/145* (2013.01); *H01L 2224/1405* (2013.01); *H01L 2224/14051* (2013.01); *H01L 2224/16238* (2013.01); *H01L 2224/17107* (2013.01); *H01L 2224/81141* (2013.01); *H01L 2224/81193* (2013.01); *H01L 2224/81815* (2013.01); *H01L 2224/81897* (2013.01); *H01L 2924/1305* (2013.01); *H01L 2924/1306* (2013.01)

(58) Field of Classification Search
CPC ... H01L 23/49811; H01L 24/13; H01L 24/14; H01L 24/81; H01L 24/17; H01L 24/11
USPC .......................................... 257/737; 438/613
See application file for complete search history.

(56) References Cited

U.S. PATENT DOCUMENTS

| 7,368,817 | B2 | 5/2008 | Pendse |
| 2001/0031548 | A1 | 10/2001 | Elenius et al. |

(Continued)

*Primary Examiner* — Walter H Swanson
(74) *Attorney, Agent, or Firm* — Hauptman Ham, LLP

(57) ABSTRACT

A semiconductor device includes a substrate having a major surface and conductive bumps distributed over the major surface of the substrate. Each conductive bump of a first subset of the conductive bumps comprises a regular body and a second subset of the conductive bumps comprises a group of separate conductive bumps uniformly distributed around a periphery of a central opening.

20 Claims, 12 Drawing Sheets

(56) References Cited

U.S. PATENT DOCUMENTS

| | | | |
|---|---|---|---|
| 2008/0003715 A1* | 1/2008 | Lee | H01L 24/11 438/108 |
| 2008/0142964 A1 | 6/2008 | Sun et al. | |
| 2009/0121302 A1 | 5/2009 | Lin et al. | |
| 2012/0001329 A1* | 1/2012 | Kim | H01L 24/14 257/738 |

* cited by examiner

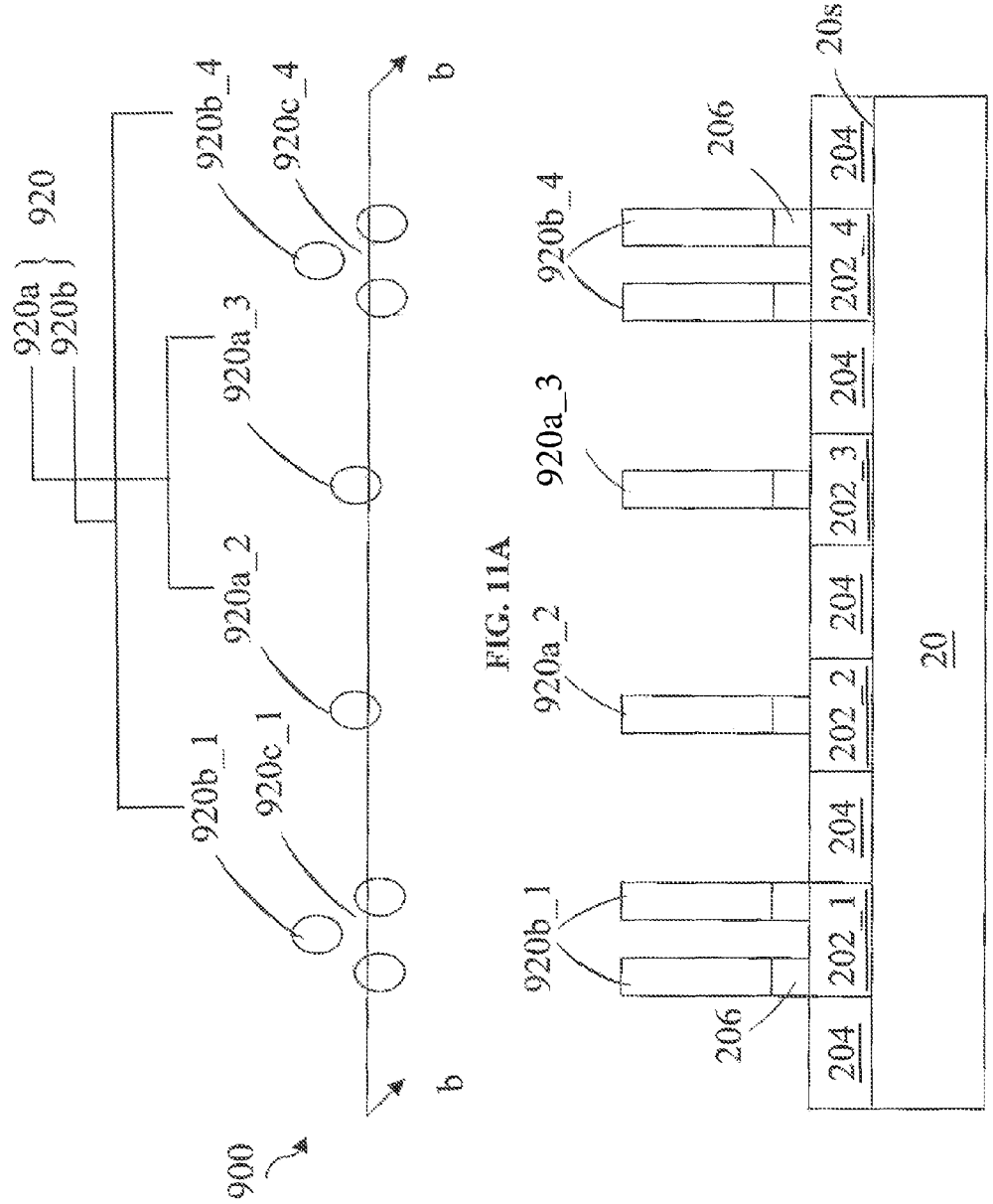

SELF-ALIGNING CONDUCTIVE BUMP STRUCTURE AND METHOD OF FABRICATION

PRIORITY CLAIM

The present application is a divisional of U.S. application Ser. No. 13/192,756, filed Jul. 28, 2011, now U.S. Pat. No. 9,024,438, issued May 5, 2015, which is incorporated herein by reference in its entirety.

FIELD

The disclosure relates to integrated circuit fabrication and, more particularly, to a semiconductor device with a conductive bump structure.

BACKGROUND

Modern integrated circuits (ICs) are formed on semiconductor chips (also referred to as dies). To increase manufacturing throughput and lower manufacturing costs, the ICs are manufactured in semiconductor wafers, each containing many identical semiconductor chips. After the ICs are manufactured, semiconductor chips are sawed from the wafers and packaged before they can be used.

In typical packaging processes, semiconductor chips are first attached to package substrates. This includes physically securing the semiconductor chips on the package substrates and connecting bonding bumps on the semiconductor chips to bonding bumps on the package substrates. Underfill, which typically comprises epoxy, is used to further secure the bonding. The semiconductor chips may be bonded using either flip-chip bonding or wire bonding. The resulting packages are referred to as ball grid array (BGA) modules. A plurality of chips having different functions may be integrated in a same BGA module to form a system-in-package (SIP) module.

Flip-chip bonding utilizes conductive bumps to establish electrical contact between a chip's contact pads and the package substrate. The bumps themselves, based on the material used, are classified as solder bumps, gold bumps, copper pillar bumps and bumps with mixed metals. However, there are challenges to implementing such features and processes in ICs fabrication. For example, it is difficult to achieve accurately bump alignment of the chip to the package substrate (both having bumps) if the bumps have been reflowed, thereby increasing the likelihood of an open circuit.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 9A-11B are schematic top-down views and cross-sectional views of a conductive bump structure of a semiconductor device at various stages of fabrication according to various aspects of the present disclosure.

DESCRIPTION

It is understood that the following disclosure provides many different embodiments, or examples, for implementing some features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity.

Figure 1:
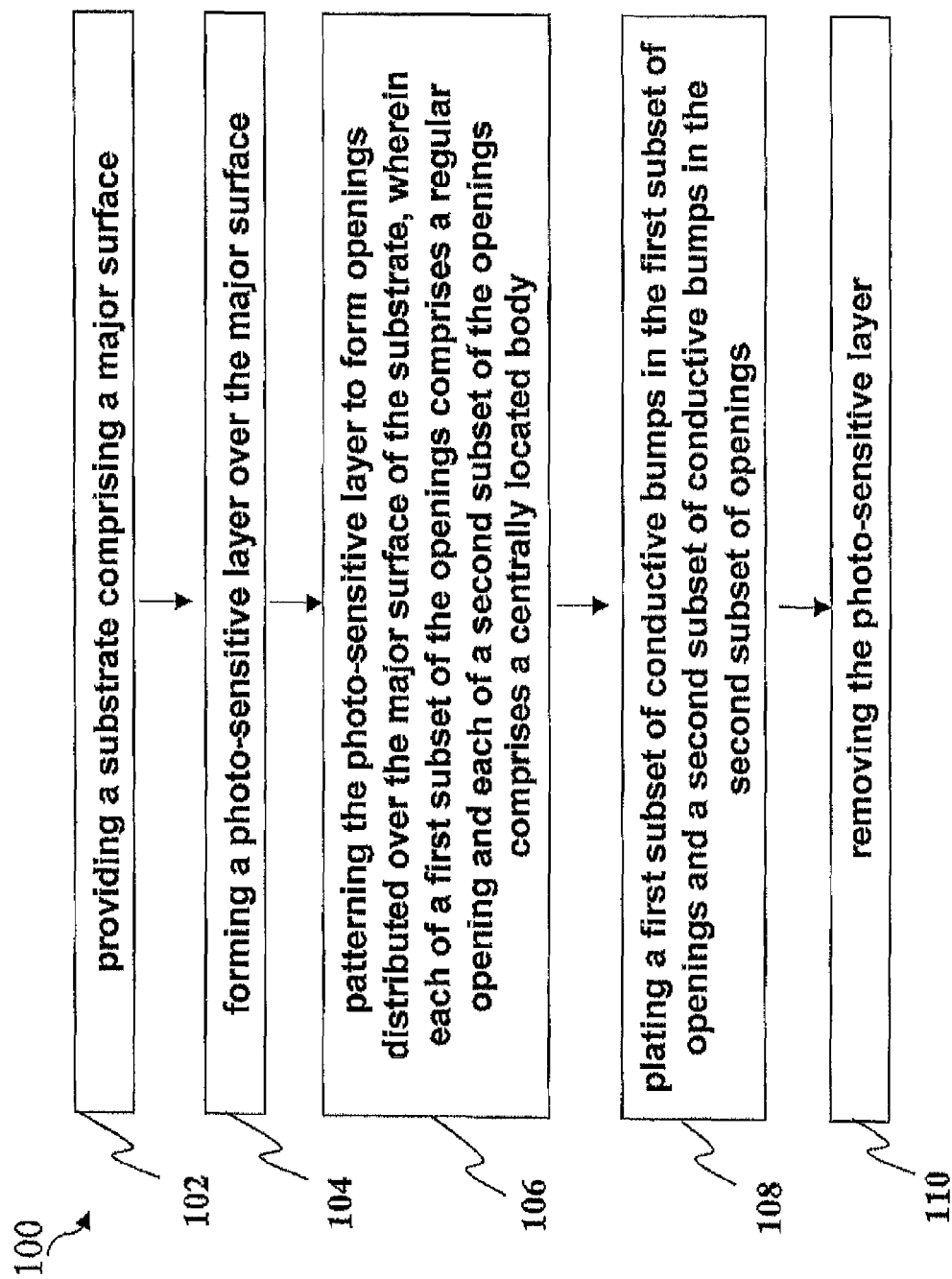
FIG. 1 is a flowchart of a method of fabricating a semiconductor device comprising a conductive bump structure according to various aspects of the present disclosure.

FIG. 1 is a flowchart of a method 100 of fabricating a semiconductor device comprising a conductive bump structure according to various aspects of the present disclosure. The method 100 begins with step 102 in which a substrate comprising a major surface is provided. The method 100 continues with step 104 in which a photo-sensitive layer is formed over the major surface. The method 100 continues with step 106 in which the photo-sensitive layer is patterned to form openings distributed over the major surface of the substrate, wherein each of a first subset of the openings comprises a regular opening and each of a second subset of the openings comprises a centrally located body. The method 100 continues with step 108 in which a first subset of conductive bumps is plated in the first subset of openings and a second subset of conductive bumps is plated in the second subset of openings. The method 100 continues with step 110 in which the photo-sensitive layer is removed. The discussion that follows illustrates an embodiment of a method in accordance with FIG. 1.

FIGS. 2-6B are schematic top-down views and cross-sectional views of a conductive bump structure 220 of a semiconductor device 200 at various stages of fabrication according to various aspects of the present disclosure. The method of FIG. 1 does not produce a completed semiconductor device. Accordingly, it is understood that additional processes may be provided before, during, and/or after the method 100 of FIG. 1, and that some other processes may only be briefly described herein. Also, FIGS. 1 through 6B are simplified for a better understanding of the inventive concepts of the present disclosure. For example, although the figures illustrate the conductive bump structure 220 of a semiconductor device 200, it is understood the semiconductor device 200 may be part of an integrated circuit (IC) package that further comprises a number of other components such as under-fill, lead-frame, etc.

Figure 2:
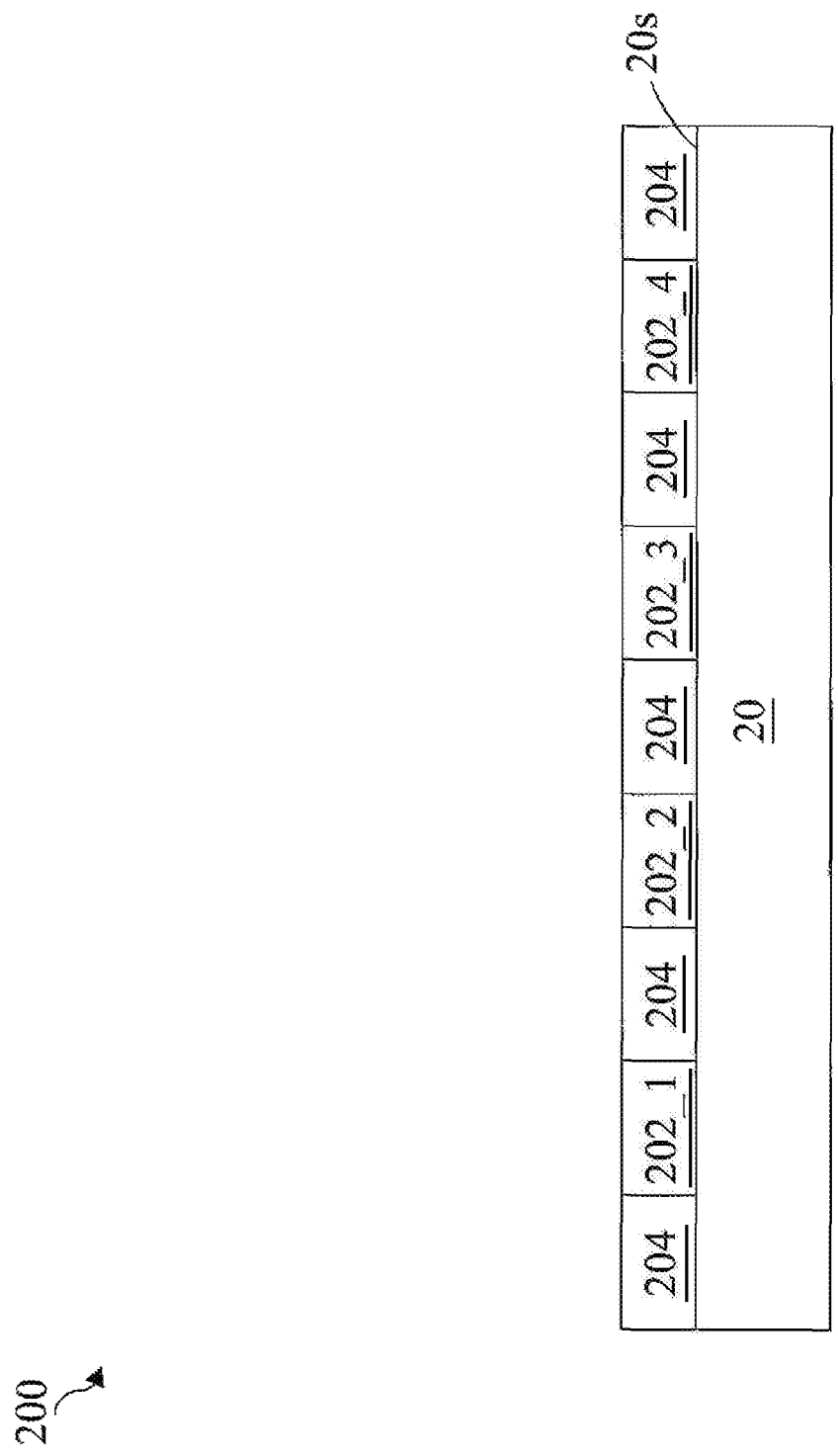
FIGS. 2-6B are schematic top-down views and cross-sectional views of a conductive bump structure of a semiconductor device at various stages of fabrication according to various aspects of the present disclosure.

Referring to FIG. 2, a substrate 20 comprising a major surface 20s is provided. The substrate 20 may comprise a silicon substrate. The substrate 20 may alternatively comprise silicon germanium, gallium arsenic, or other suitable semiconductor materials. The substrate 20 may further comprise other features such as various doped regions, a buried layer, and/or an epitaxy layer. Furthermore, the substrate 20 may be a semiconductor on insulator such as silicon on insulator (SOI) or silicon on sapphire. In other embodiments, the substrate 20 may comprise a doped epi layer, a gradient semiconductor layer, and/or may further include a semiconductor layer overlying another semiconductor layer of a different type such as a silicon layer on a silicon germanium layer. In other examples, a compound semiconductor substrate 20 may comprise a multilayer silicon structure or a silicon substrate may include a multilayer compound semiconductor structure.

The substrate 20 further comprises a plurality of isolation regions (not shown). The isolation regions may utilize isolation technology, such as local oxidation of silicon (LOCOS) or shallow trench isolation (STI), to define and electrically isolate the various microelectronic elements (not shown). In the present embodiment, the isolation regions include a STI. The isolation regions may comprise silicon oxide, silicon nitride, silicon oxynitride, other suitable materials, and/or combinations thereof. The isolation regions, and in the present embodiment, the STI, may be formed by any suitable process. As one example, the formation of the STI may include patterning the semiconductor substrate 20 by a photolithography process known to the applicants, etching a trench in the substrate 20 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Examples of the various microelectronic elements that may be formed in the substrate 20 include transistors (e.g., p-channel/n-channel metal oxide semiconductor field effect transistors (pMOSFETs/nMOSFETs), bipolar junction transistors (BJTs), high voltage transistor, high frequency transistor, etc.); diodes; resistors; capacitors; inductors; fuses; and/or other suitable elements. Various processes are performed to form the various microelectronic elements including deposition, photolithography, implantation, etching, annealing, and other suitable processes. The microelectronic elements are interconnected to form the IC device, such as a logic device, memory device (e.g., static random access memory or SRAM), radio frequency (RF) device, input/output (I/O) device, system-on-chip (SoC) device, combinations thereof, and other suitable types of devices.

The substrate 20 further comprises inter-layer dielectric (ILD) layers, inter-metal dielectric (IMD) layers and an interconnect structure overlying the integrated circuits (not shown). The IMD layers in the interconnect structure include low dielectric constant (low-k) dielectric materials, un-doped silicate glass (USG), fluorine-doped silicate glass (FSG), carbon-doped silicate glass, silicon nitride, silicon oxynitride, or other commonly used materials. The dielectric constants of the low-k dielectric materials may range from 2.0 to 3.9. Metal lines in the interconnect structure may be formed of copper or copper alloys. One skilled in the art will realize the formation details of the interconnect structure.

A plurality of contact pads 202 (depicted as 202_1, 202_2, 202_3, and 202_4) is a top interconnect layer formed in a top-level IMD layer 204, which is a portion of conductive routes and has an exposed surface treated by a planarization process, such as chemical mechanical polishing (CMP), if necessary. Suitable materials for the plurality of contact pads 202 may comprise, but are not limited to, for example Cu, Al, AlCu, Al alloy, Cu alloy, or other conductive materials. The plurality of contact pads 202 is used in the bonding process to connect the integrated circuits in the respective chip to external features.

Then, conductive bumps are formed over the plurality of contact pads 202 to establish an electrical and mechanical connection to conductive bumps on a package substrate to form a package assembly. In one example, flux may be disposed in the end of the bump to facilitate formation of joints between the bumps of the two substrates. Both bumps may be formed of reflowable material, such as solder, or one or the other of the bumps may be formed of a non-reflowable material, such as copper, which may also function as a standoff between the two substrates.

However, in the process of placing a bumped chip onto a package substrate, some problems are likely to occur while placing the chip on the package substrate even without the chip slipping, thereby causing misalignment with the package substrate and thus increasing the likelihood of an open circuit. For example, if one or both sets of solder bumps have been reflowed, alignment of the chip involves balancing one solder bump ball on top of another solder bump ball. Evidently, based on the applications' observation, a ball does not inherently want to rest upon another ball, and this unstable configuration is subject to misalignment of the chip with the substrate.

Accordingly, the processing discussed below with reference to FIGS. 3-6B and 9A-11B may provide mechanical registration between a chip and a package substrate by securely chucking the chip, i.e., holding it in precise mechanical alignment with the package substrate during the assembly process, to avoid movement (misalignment) of the chip while the bumps are being reflowed. This can reduce the occurrence of an open circuit.

Figure 3:
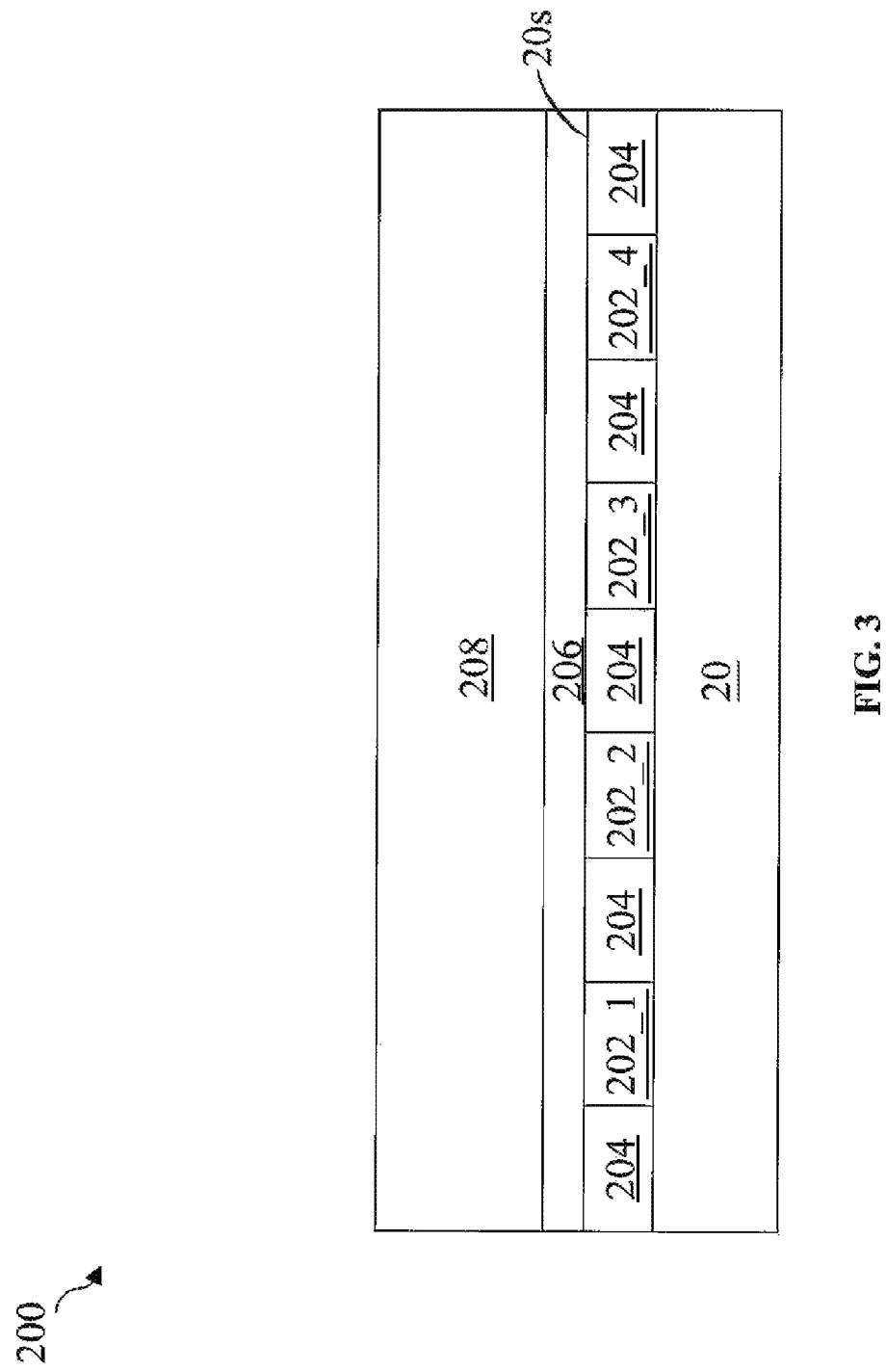

Referring to FIG. 3, after the plurality of contact pads 202 formation process, a conductive layer 206 is formed over the plurality of contact pads 202 and IMD layer 204. Any standard conductive material may be employed in embodiments of the invention. In one embodiment, the conductive layer 206 is formed of Cu by physical vapor deposition (PVD) or sputtering. In another embodiment, the conductive layer 206 may be formed of Cu alloys that comprise Ag, Cr, Ni, Sn, Au, and combinations thereof. The conductive layer 206 is deposited to a thickness of between about 0.4 and 0.6 μm.

Then, a photo-sensitive layer 208 is formed over the conductive layer 206, thereby over the major surface 20s of the substrate 20. In some embodiments, the photo-sensitive layer 208 may be a dry film or a photo-resist film. The photo-sensitive layer 208 may be applied over the conductive layer 206 by deposition processes known to the applicants. In at least one embodiment, the photo-sensitive layer 208 is formed by laminating a dry film over the conductive layer 206 having a thickness of from about 20 μm to about 30 μm. In another embodiment, the photo-sensitive layer 208 is formed by spin-coating a photo-resist film over the conductive layer 206 to obtain a thickness of from about 20 μm to about 30 μm. It is understood that the thickness of the photo-sensitive layer 208 can be controlled and selected to be a predetermined value, this especially in relation to the thickness of the column of a to-be-formed conductive bump material.

In the present embodiment, FIGS. 4A-6A are schematic top-down views of the conductive bump structure 220 of the semiconductor device 200 at various stages of fabrication according to various aspects of the present disclosure. FIGS. 4B-6B are cross-sectional views of the conductive bump structure 220 of the semiconductor device 200 taken along the line a-a of FIGS. 4A-6A.

Figures 4A, 4B:
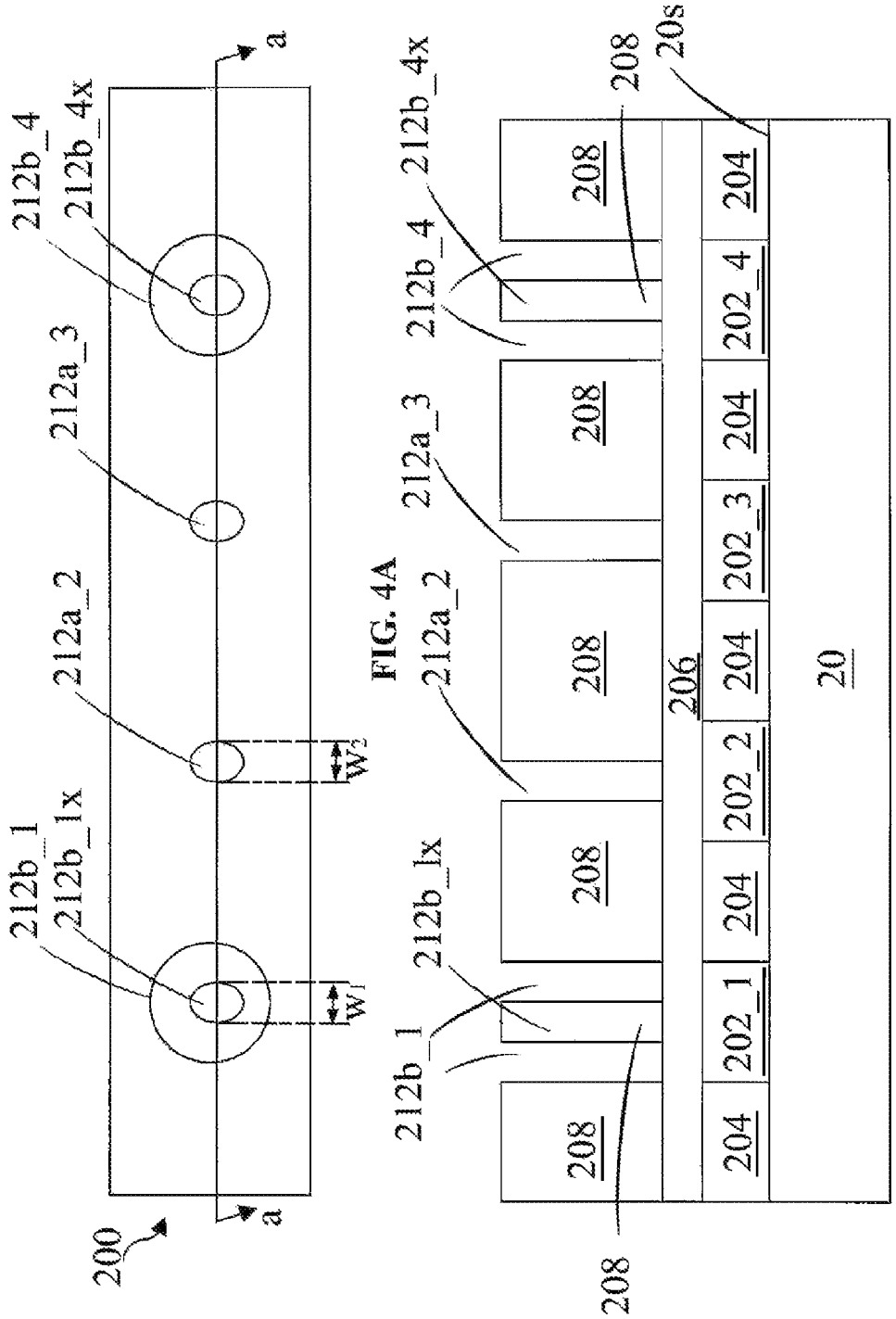

FIGS. 4A and 4B depicts the semiconductor device 200 of FIG. 3 after patterning the photo-sensitive layer 208 to form openings 212a/212b distributed over the major surface 20s of the substrate 20, wherein each of a first subset of the openings 212a (i.e., 212a_2 and 212a_3) comprises a regular opening and each of a second subset of the openings 212b (i.e., 212b_1 and 212b_4) comprises a centrally located body 212b_1x/212b_4x. In the present embodiment, a width $W_1$ of centrally located body 212b_1x/212b_4x may be substantially equal to a width $W_2$ of each of the first subset of the openings 212a, although the width $W_1$ may be greater or smaller than $W_2$.

In at least one embodiment, the first photo-sensitive layer 208 is patterned by processes known to the applicants to form the openings 212a/212b distributed over the major surface 20s of the substrate 20 (i.e., over a portion of the plurality of the contact pads 202), exposing a portion of the conductive layer 206 for defining a window of the conductive bump structure 220.

Figure 5A:
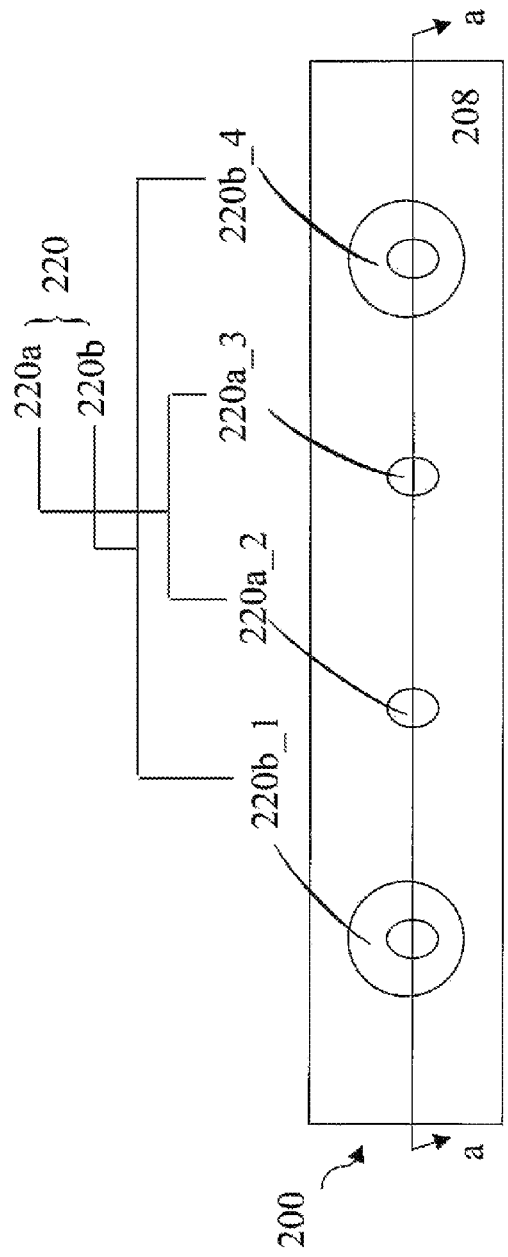
Figure 5B:
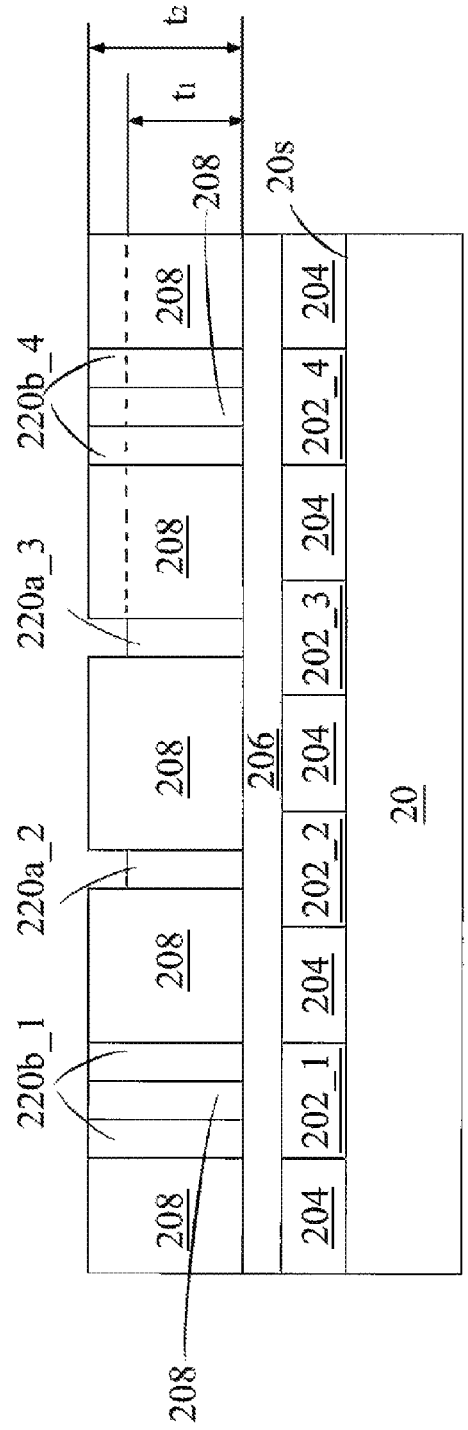

Referring to FIGS. 5A and 5B, following patterning the photo-sensitive layer 208, a first subset of conductive bumps 220a (220a_2 and 220a_3) is plated in the first subset of openings 212a and a second subset of conductive bumps 220b (220b_1 and 220b_4) is plated in the second subset of openings 212b. Thus, conductive bumps 220a/220b (i.e., the conductive bump structure 220) are distributed over the major surface 20s of the substrate 20, wherein each of a first subset of the conductive bumps 220a comprise a regular body 220a_2/220a_3 and each of a second subset of the conductive bumps 220b comprise a ring-shaped body 220b_1/220b_4. In at least one embodiment, the ring-shaped body 220b_1/220b_4 comprises substantially vertical sidewalls. In another embodiment, the ring-shaped body 220b_1/220b_4 comprises tapered sidewalls. In some embodiments, a top-down view of the ring-shaped body 220b_1/220b_4 comprises a shape selected from circle, square, and rectangular.

In the present embodiment, the first subset of conductive bumps 220a and second subset of conductive bumps 220b are combined and referred as the conductive bump structure 220 of the semiconductor device 200. In some embodiments, the openings 212a/212b are partially or fully filled with the conductive bump structure 220 by suitable formations methods. In at least one embodiment, the conductive bump structure 220 is formed upward along the openings 212a/212b using the conductive layer 206 as a seed layer.

In an exemplary embodiment, a first thickness $t_1$ of the regular body 220a_2/220a_3 is greater than 15 µm. For example, the regular body 220a_2/220a_3 is of about 15-29 µm thickness, although the thickness may be greater or smaller. Theoretically, a larger-area opening may accommodate more plating material than a smaller-area opening due to larger current crowding. Since area of each of the second subset of the openings 212b is greater than area of each of the first subset of the openings 212a, the ring-shaped body 220b_1/220b_4 has a second thickness $t_2$ greater than the first thickness $t_1$.

In at least one embodiment, the conductive bumps 220a/220b comprise a heat re-flowable material. For example, the conductive bumps 220a/220b may comprise Sn, SnAg, Sn—Pb, SnAgCu, SnAgZn, SnZn, SnBi—In, Sn—In, Sn—Au, SnPb, SnCu, SnZnIn, or SnAgSb, etc. In another embodiment, the conductive bumps 220a/220b comprise a non-flowable material. For example, the conductive bumps 220a/220b may comprise Cu, Ag, Au, Cu alloy, Ag alloy, or Au alloy. In some embodiments, the formation methods may include sputtering, printing, electro plating, electroless plating, and/or commonly used chemical vapor deposition (CVD) methods. For example, electro-chemical plating (ECP) is carried out to form the conductive bumps 220a/220b.

Figure 6A:
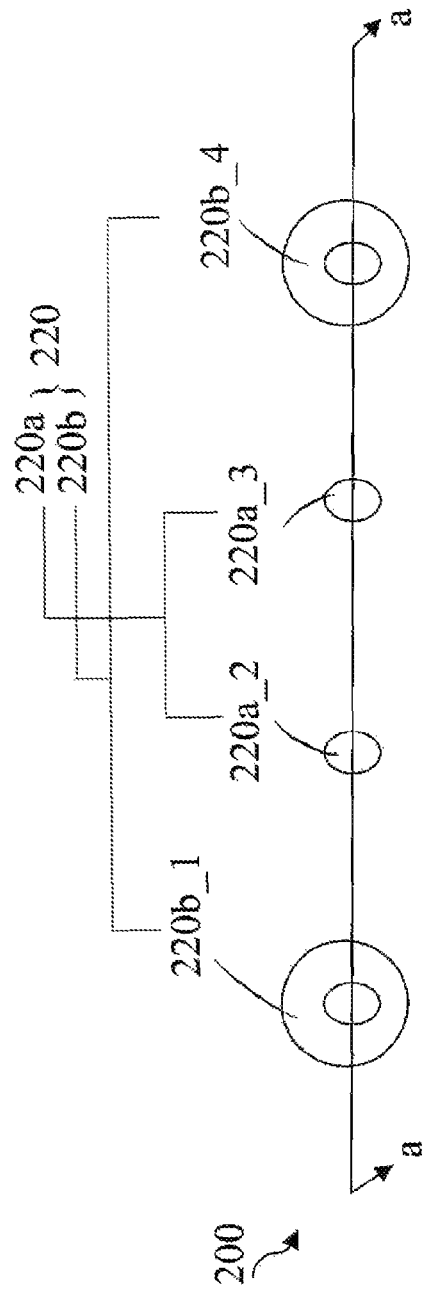
Figure 6B:
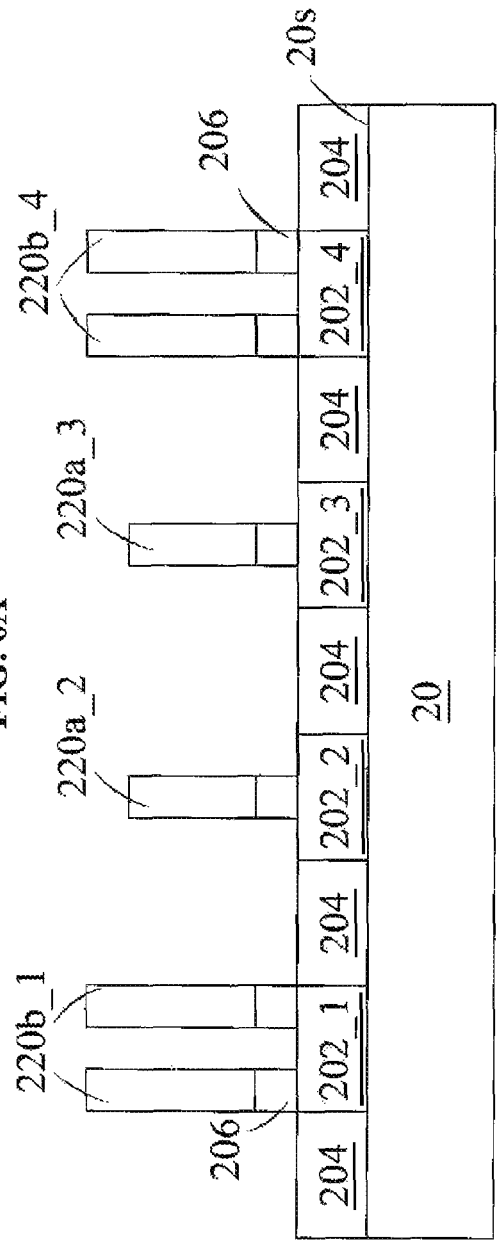

Referring to FIGS. 6A and 6B, after plating the conductive bumps structure 220, the photo-sensitive layer 208 is removed. In the present embodiment, the photo-sensitive layer 208 may be removed using wet etching or dry etching processes. Then, using the conductive bump structure 220 as a hard-mask, as depicted in FIGS. 6A and 6B, a portion of the conductive layer 206 is removed to expose the IMD layer 204 and a portion of the contact pads 202. The step of removing a portion of the conductive layer 206 is performed using a wet etching process. For example, the wet etching process comprises removing a portion of the conductive layer 206 in a solution comprising $H_3PO_3$ and $H_2O_2$. Structurally, the conductive bump structure 220 actually contains the conductive bump structure 220 itself and remaining conductive layer 206 located between the conductive bump structure 220 and contact pads 202.

Figure 7:
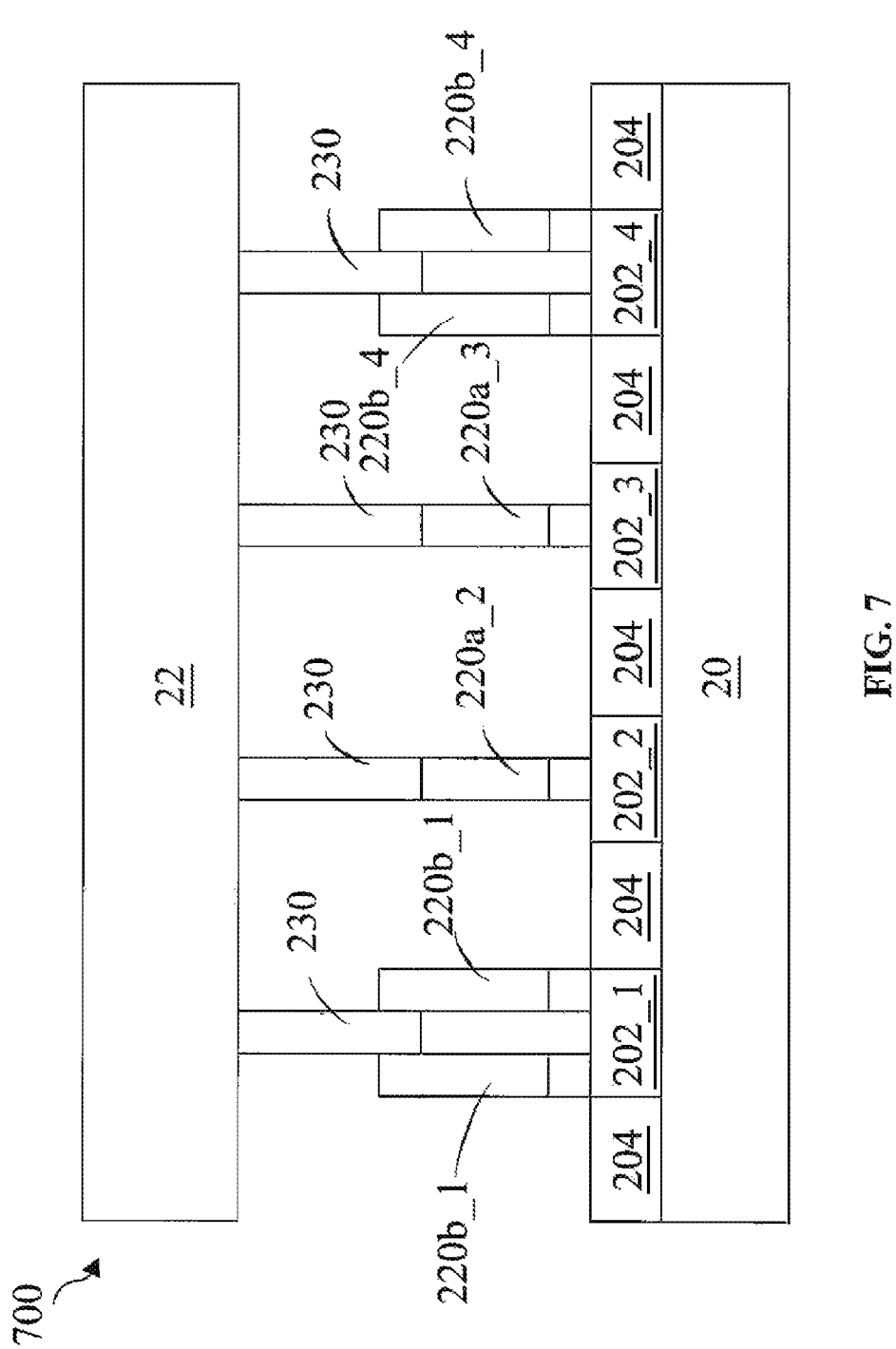
FIG. 7 is a cross-sectional view of a semiconductor device bonded to a package substrate according to various aspects of the present disclosure.

FIG. 7 depicts bonding of the semiconductor device 200 to a package substrate 22 according to various aspects of the present disclosure. With the ring-shaped body 220b_1/220b_4 applied in the formation of the conductive bumps 220. The conductive bumps 220 are accurately aligned with respective ones of bumps 230 on the package substrate 22. After the structure as shown in FIG. 7 is formed, the bumps 220, 230 are being reflowed or fused to one another to form a package assembly 700. This can reduce the occurrence of an open circuit. The bonding technique is also useful for joining die-to-die, die-to-substrate, or package-to-substrate in a package assembly.

Figure 8:
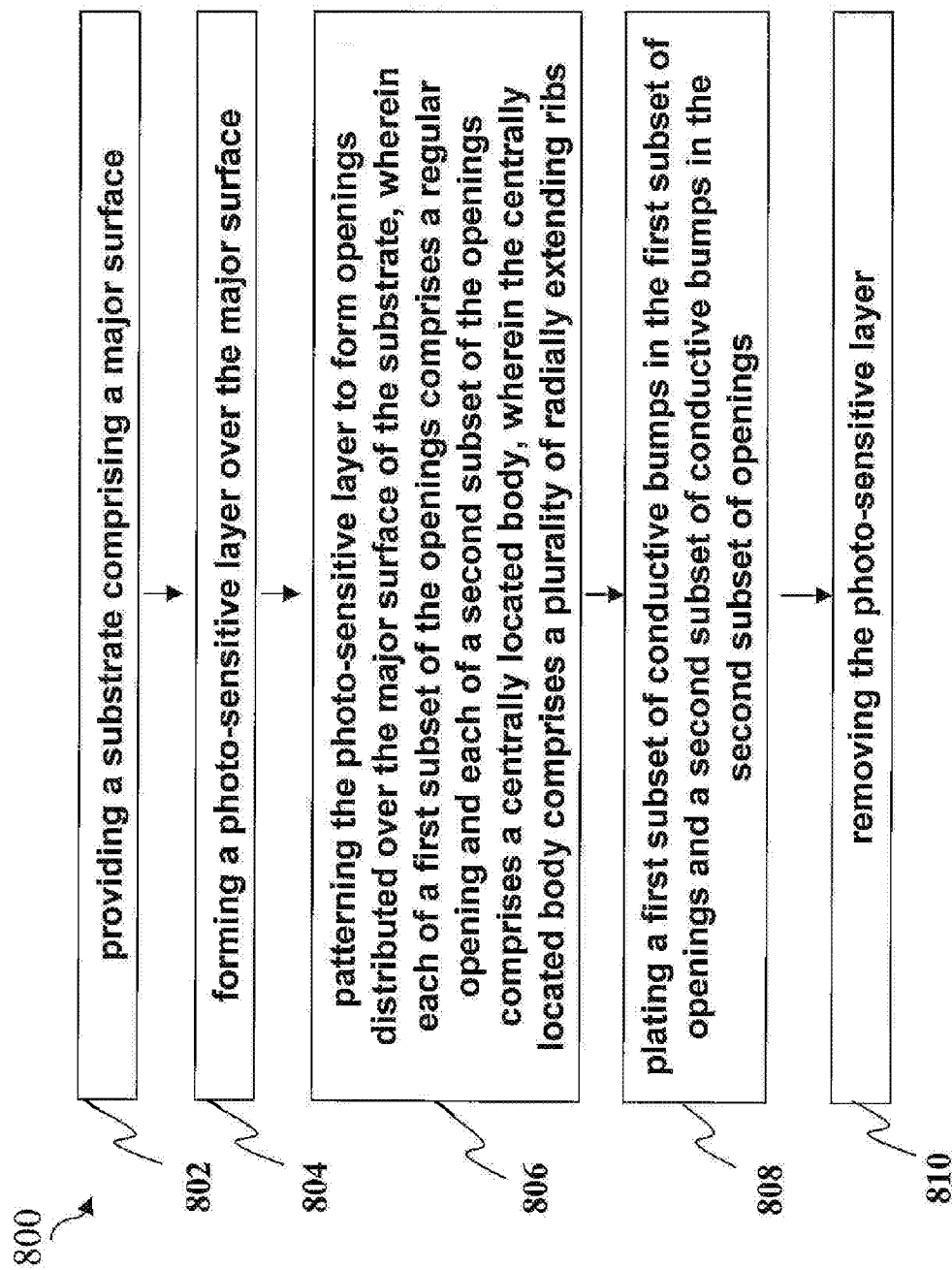
FIG. 8 is a flowchart of a method of fabricating a semiconductor device comprising a conductive bump structure according to various aspects of the present disclosure.

FIG. 8 is a flowchart of an alternate method 800 of fabricating a semiconductor device comprising a conductive bump structure according to various aspects of the present disclosure. The method 800 begins with step 802 in which a substrate comprising a major surface is provided. The method 800 continues with step 804 in which a photo-sensitive layer is formed over the major surface. The method 800 continues with step 806 in which the photo-sensitive layer is patterned to form openings distributed over the major surface of the substrate, wherein each of a first subset of the openings comprises a regular opening and each of a second subset of the openings comprises a centrally located body, wherein the centrally located body comprises a plurality of radially extending ribs. The method 800 continues with step 808 in which a first subset of conductive bumps is plated in the first subset of openings and a second subset of conductive bumps is plated in the second subset of openings. The method 800 continues with step 810 in which the photo-sensitive layer is removed. The discussion that follows illustrates an embodiment of a method in accordance with FIG. 8.

FIGS. 9A-11B are schematic top-down views and cross-sectional views of a conductive bump structure 920 of a semiconductor device 900 at various stages of fabrication according to various aspects of the present disclosure. The method of FIG. 8 does not produce a completed semiconductor device. Accordingly, it is understood that additional processes may be provided before, during, and/or after the method 800 of FIG. 8, and that some other processes may only be briefly described herein. Also, FIGS. 8 through 11B are simplified for a better understanding of the inventive concepts of the present disclosure. For example, although the figures illustrate the conductive bump structure 920 of a semiconductor device 900, it is understood the semiconductor device 900 may be part of an integrated circuit (IC) package that further comprises a number of other components such as under-fill, lead-frame, etc. Further, the semiconductor device 900 is similar to the semiconductor device 200 of FIG. 2.

Accordingly, similar feature in FIGS. 2 and 9 are numbered the same for the sake of clarity and simplicity.

In the present embodiment, FIGS. 9A-11A are schematic top-down views of the conductive bump structure 920 of the semiconductor device 900 at various stages of fabrication according to various aspects of the present disclosure. FIGS. 9B-11B are cross-sectional views of the conductive bump structure 920 of the semiconductor device 900 taken along the line b-b of FIGS. 9A-11A.

Figure 9A:
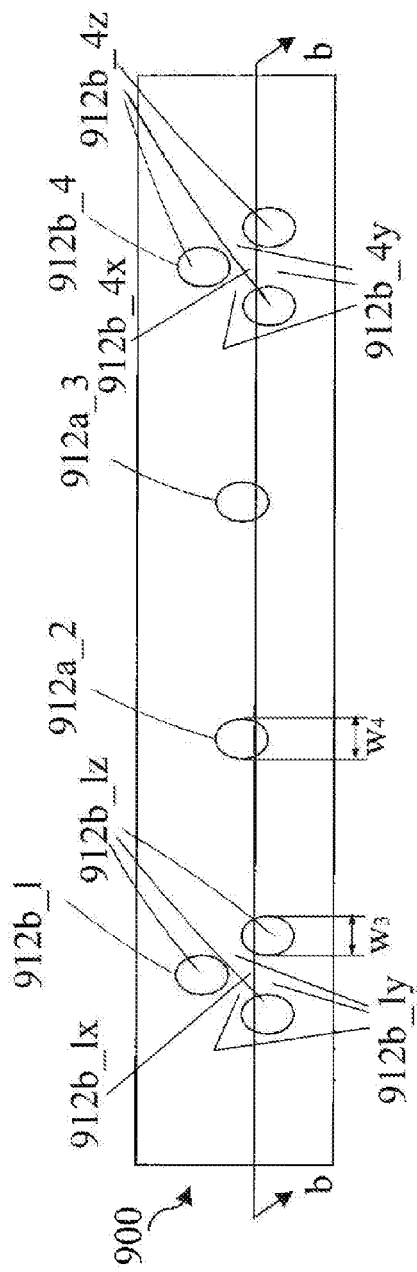
Figure 9B:
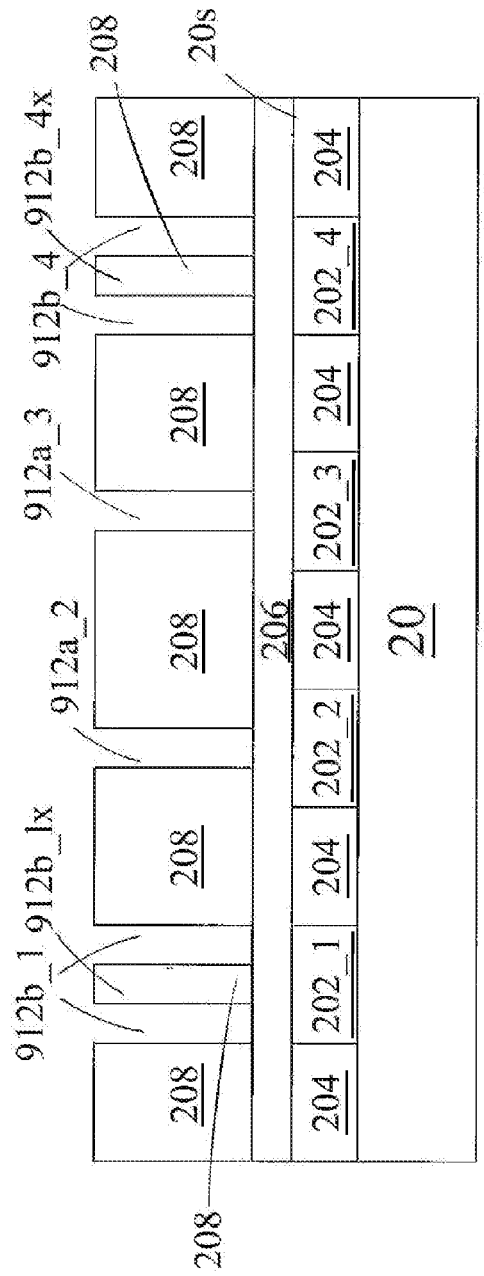

FIGS. 9A and 9B depicts the semiconductor device 900 (similar to the device 200 depicted in FIG. 3) after patterning the photo-sensitive layer 208 to form openings 912a/912b distributed over the major surface 20s of the substrate 20, wherein each of a first subset of the openings 912a (i.e., 912a_2 and 912a_3) comprises a regular opening and each of a second subset of the openings 912b (i.e., 912b_1 and 912b_4) comprises a centrally located body 912b_1x/912b_4x, wherein the centrally located body 912b_1x/912b_4x comprises a plurality of radially extending ribs 912b_1y/912b_4y. Further, each of the second subset of the openings 912b (i.e., 912b_1 and 912b_4) comprises a group of separate openings 912b_1z/912b_4z. The group of separate openings 912b_1z/912b_4z comprises at least 3 openings. In the present embodiment, a width $W_3$ of the separate openings 912b_1z/912b_4z may be substantially equal to a width $W_4$ of each of the first subset of the openings 112a, although the width $W_3$ may be greater than $W_4$.

In at least one embodiment, the first photo-sensitive layer 208 is patterned by processes known to the applicants to form the openings 912a/912b distributed over the major surface 20s of the substrate 20 (i.e., over a portion of the plurality of the contact pads 202), exposing a portion of the conductive layer 206 for defining a window of the conductive bump structure 920.

Figure 10A:
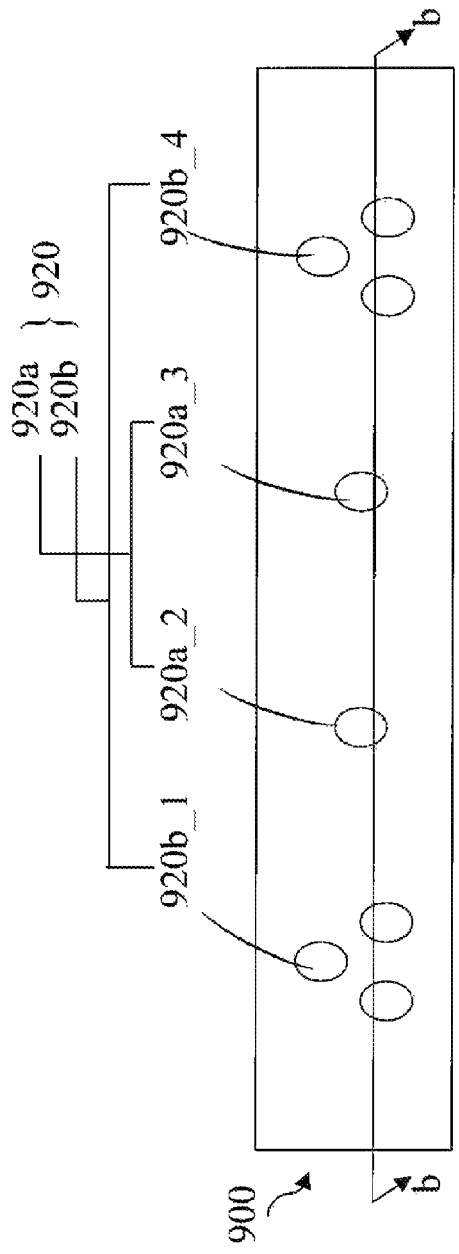
Figure 10B:
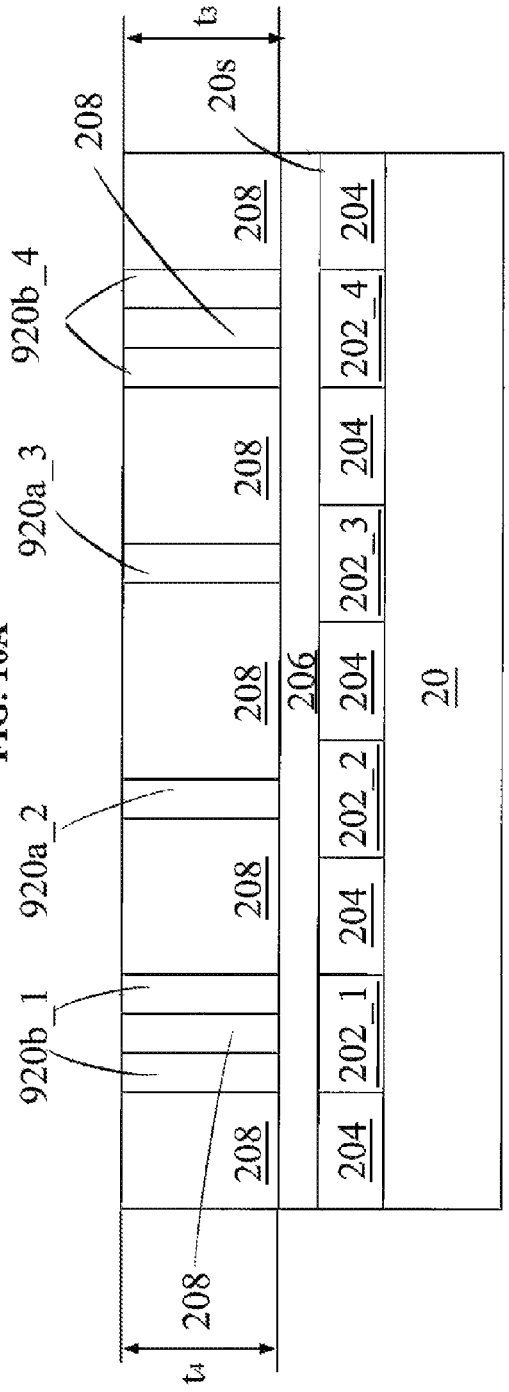

Referring to FIGS. 10A and 10B, following patterning the photo-sensitive layer 208, a first subset of conductive bumps 920a is plated in the first subset of openings 912a and a second subset of conductive bumps 920b is plated in the second subset of openings 912b. Thus, conductive bumps 920a/920b (i.e., the conductive bump structure 920) are distributed over the major surface 20s of the substrate 20, wherein each of a first subset of the conductive bumps 920a comprise a regular body 920a_2/920a_3 and each of a second subset of the conductive bumps 920b comprise a group of separate conductive bumps 920b_1/920b_4 uniformly distributed around periphery of a central opening 920c_1/920c_4 (shown in FIG. 11A). In some embodiments, the group of separate conductive bumps 920b_1/920b_4 comprises at least 3 conductive bumps. In at least one embodiment, each of the separate conductive bumps 920b_1/920b_4 comprises substantially vertical sidewalls. In another embodiment, each of the separate conductive bumps 920b_1/920b_4 comprises tapered sidewalls. In the present embodiment, the regular body 920a_2/920a_3 has a third thickness $t_3$ and each of the separate conductive bumps 920b_1/920b_4 has a fourth thickness $t_4$ substantially equal to the first thickness $t_3$.

In the present embodiment, the first subset of conductive bumps 920a and second subset of conductive bumps 920b are combined and referred as the conductive bump structure 920 of the semiconductor device 900. In some embodiments, the openings 912a/912b are partially or fully filled with the conductive bump structure 920 by suitable formations methods. In at least one embodiment, the conductive bump structure 920 is formed upward along the openings 912a/912b using the conductive layer 206 as a seed layer.

In at least one embodiment, the conductive bumps 920a/920b comprise a heat re-flowable material. For example, the conductive bumps 920a/920b may comprise Sn, SnAg, Sn—Pb, SnAgCu, SnAgZn, SnZn, SnBi—In, Sn—In, Sn—Au, SnPb, SnCu, SnZnIn, or SnAgSb, etc. In another embodiment, the conductive bumps 920a/920b comprise a non-flowable material. For example, the conductive bumps 920a/920b may comprise Cu, Ag, Au, Cu alloy, Ag alloy, or Au alloy. In some embodiments, the formation methods may include sputtering, printing, electro plating, electroless plating, and commonly used chemical vapor deposition (CVD) methods. For example, electro-chemical plating (ECP) is carried out to form the conductive bumps 920a/920b.

Referring to FIGS. 11A and 11B, after plating the conductive bumps structure 920, the photo-sensitive layer 208 is removed. In the present embodiment, the photo-sensitive layer 208 may be removed using wet etching or dry etching processes. Then, using the conductive bump structure 920 as a hard-mask, as depicted in FIGS. 11A and 11B, a portion of the conductive layer 206 is removed to expose the IMD layer 204 and a portion of the contact pads 202. The step of removing a portion of the conductive layer 206 is performed using a wet etching process. For example, the wet etching process comprises removing a portion of the conductive layer 206 in a solution comprising $H_3PO_3$ and $H_2O_2$. Structurally, the conductive bump structure 920 actually contains the conductive bump structure 920 itself and remaining conductive layer 206 located between the conductive bump structure 920 and contact pads 202.

Figure 12:
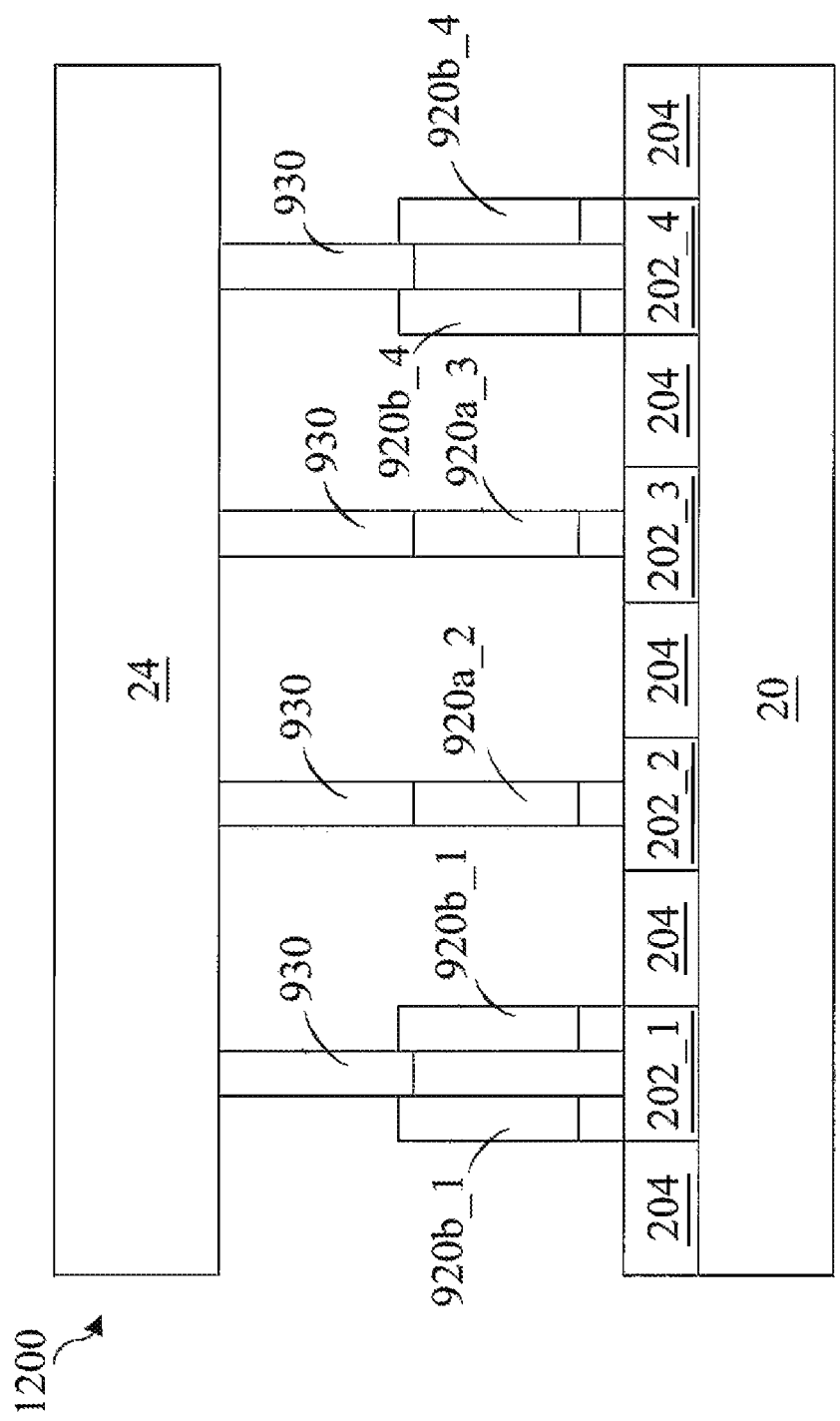
FIG. 12 is a cross-sectional view of a semiconductor device bonded to a package substrate according to various aspects of the present disclosure.

FIG. 12 depicts bonding of the semiconductor device 900 to a package substrate 24 according to various aspects of the present disclosure. With the group of separate conductive bumps 920b_1/920b_4 applied in the formation of the conductive bumps 920. The conductive bumps 920 are accurately aligned with respective ones of bumps 930 on the package substrate 24. After the structure as shown in FIG. 12 is formed, the bumps 920, 930 are being reflowed or fused to one another to form a package assembly 1200. This can reduce the occurrence of having an open circuit. The bonding technique is also useful for joining die-to-die, die-to-substrate, or package-to-substrate in a package assembly.

It is understood that the package assemblies 700, 1200 may undergo further complementary metal-oxide-semiconductor (CMOS) processing to complete the IC fabrication.

In some embodiments, a semiconductor device comprises a substrate comprising a major surface and conductive bumps distributed over the major surface of the substrate. Each conductive bump of a first subset of the conductive bumps comprises a regular body and a second subset of the conductive bumps comprises a group of separate conductive bumps uniformly distributed around a periphery of a central opening.

In some embodiments, an assembly comprises a first substrate, the first substrate comprising a major surface and a first plurality of conductive bumps distributed over the major surface. Each conductive bump of the first plurality of conductive bumps is positioned over and electrically connected to a contact pad. Each conductive bump of a first subset of the first plurality of conductive bumps comprises a regular body, and a second subset of the first plurality of conductive bumps comprises a group of separate conductive bumps uniformly distributed around a periphery of a central opening. A second substrate comprises a second plurality of conductive bumps, and a first subset of the second plurality of conductive bumps comprises a conductive bump configured to align with the central opening of the group of separate conductive bumps on the first substrate.

In some embodiments, a method of fabricating a conductive bump structure comprises forming a photo-sensitive layer over a major surface of a first substrate and patterning the photo-sensitive layer to form openings distributed over the major surface of the first substrate. Each opening exposes a portion of a conductive layer, each opening of a first subset of the openings comprises a regular opening, and each opening of a second subset of the openings comprises a centrally located body and a plurality of radially extending ribs. The method further comprises forming a first subset of conductive bumps in the first subset of openings and a second subset of conductive bumps in the second subset of openings.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device comprising:
    a substrate comprising a major surface; and
    conductive bumps distributed over the major surface of the substrate, wherein each conductive bump of a first subset of the conductive bumps comprises a regular body and a second subset of the conductive bumps comprises a group of separate conductive bumps uniformly distributed around a periphery of a central opening, wherein a shape of each conductive bump of the first subset is substantially equal to a shape of each conductive bump of the second subset.

2. The semiconductor device of claim 1, wherein the regular body has a first thickness and each of the separate conductive bumps has a second thickness substantially equal to the first thickness.

3. The semiconductor device of claim 1, wherein the group of separate conductive bumps comprises at least three conductive bumps.

4. The semiconductor device of claim 1, wherein at least one of the separate conductive bumps comprises substantially vertical sidewalls.

5. The semiconductor device of claim 1, wherein at least one of the separate conductive bumps comprises tapered sidewalls.

6. The semiconductor device of claim 1, wherein the conductive bumps comprise a heat re-flowable material.

7. The semiconductor device of claim 1, wherein the conductive bumps comprise a non-flowable material.

8. The semiconductor device of claim 1, wherein the conductive bumps comprise Sn, SnAg, Sn—Pb, SnAgCu, SnAgZn, SnZn, SnBi—In, Sn—In, Sn—Au, SnPb, SnCu, SnZnIn, or SnAgSb.

9. The semiconductor device of claim 1, wherein the conductive bumps comprise Cu, Ag, Au, Cu alloy, Ag alloy, or Au alloy.

10. The semiconductor device of claim 1, wherein each separate conductive bump of the group of separate conductive bumps is positioned over a separate conductive layer.

11. The semiconductor device of claim 10, wherein each separate conductive layer comprises Cu.

12. An assembly comprising:
    a first substrate, the first substrate comprising:
        a major surface; and
        a first plurality of conductive bumps distributed over the major surface, wherein each conductive bump of the first plurality of conductive bumps is positioned over and electrically connected to a contact pad, each conductive bump of a first subset of the first plurality of conductive bumps comprises a regular body, and a second subset of the first plurality of conductive bumps comprises a group of separate conductive bumps uniformly distributed around a periphery of a central opening; and
    a second substrate, the second substrate comprising a second plurality of conductive bumps, wherein a first subset of the second plurality of conductive bumps comprises a conductive bump aligned with and insertable into the central opening of the group of separate conductive bumps on the first substrate.

13. The assembly of claim 12, wherein each conductive bump of the first plurality of conductive bumps comprises a heat re-flowable material.

14. The assembly of claim 12, wherein each conductive bump of the second plurality of conductive bumps comprises a heat re-flowable material.

15. The assembly of claim 12, wherein each conductive bump of a second subset of the second plurality of conductive bumps is aligned with a corresponding conductive bump of the first subset of the first plurality of conductive bumps.

16. A method of fabricating a conductive bump structure, the method comprising:
    forming a photo-sensitive layer over a major surface of a first substrate;
    patterning the photo-sensitive layer to form openings distributed over the major surface of the first substrate, wherein each opening exposes a portion of a conductive layer, each opening of a first subset of the openings comprises a regular opening, and each opening of a second subset of the openings comprises a centrally located body and a plurality of radially extending ribs;
    forming a first subset of conductive bumps in the first subset of openings and a second subset of conductive bumps in the second subset of openings; and
    removing a portion of the conductive layer to expose a portion of a contact pad using a wet etching process.

17. The method of claim 16, wherein the forming the first subset of conductive bumps and the second subset of conductive bumps is performed using a plating process.

18. The method of claim 16, wherein the forming the second subset of conductive bumps comprises forming a group of separate conductive bumps uniformly distributed around a periphery of an opening.

19. The method of claim 16, further comprising bonding the first subset of conductive bumps and the second subset of conductive bumps to respective conductive bumps on a second package substrate.

20. The method of claim 16, wherein a shape of each conductive bump of the first subset is substantially equal to a shape of each conductive bump of the second subset.

* * * * *